(12) United States Patent
Cloud (10) Patent No.: US 6,622,224 B1
(45) Date of Patent: *Sep. 16, 2003

(54) INTERNAL BUFFERED BUS FOR A DRUM

(75) Inventor: Eugene H. Cloud, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/999,292

(22) Filed: Dec. 29, 1997

(51) Int. Cl.[7] ............................................... G06F 12/00
(52) U.S. Cl. ...................... 711/158; 711/154; 710/52; 365/221
(58) Field of Search ................................. 711/158, 154, 711/5, 105; 710/105, 128, 52–57; 365/221

(56) References Cited

U.S. PATENT DOCUMENTS

| | | | |
|---|---|---|---|
| 4,891,794 A | | 1/1990 | Hush et al. ............. 365/189.04 |
| 5,029,124 A | * | 7/1991 | Leahy et al. ................ 710/105 |
| 5,072,420 A | * | 12/1991 | Conley et al. .............. 427/130 |
| 5,146,592 A | * | 9/1992 | Pfeiffer et al. .............. 345/344 |
| 5,313,624 A | * | 5/1994 | Harriman et al. .............. 714/6 |
| 5,361,003 A | | 11/1994 | Roberts ........................ 326/21 |
| 5,398,325 A | * | 3/1995 | Chang et al. .................. 711/3 |
| 5,469,558 A | * | 11/1995 | Lieberman et al. ........ 710/105 |
| 5,490,260 A | * | 2/1996 | Miller et al. ................ 711/100 |
| 5,555,429 A | | 9/1996 | Parkinson et al. .......... 395/800 |
| 5,561,466 A | * | 10/1996 | Kiriyama .................... 348/423 |
| 5,611,075 A | * | 3/1997 | Garde ......................... 711/153 |
| 5,615,355 A | * | 3/1997 | Wagner ...................... 711/167 |
| 5,666,494 A | * | 9/1997 | Mote, Jr. .................... 711/167 |
| 5,675,749 A | * | 10/1997 | Hartvigsen et al. ......... 710/128 |
| 5,784,705 A | * | 7/1998 | Leung ........................ 711/169 |
| 5,799,209 A | * | 8/1998 | Chatter ........................ 710/56 |
| 5,822,772 A | * | 10/1998 | Chan et al. ................. 711/158 |
| 5,838,603 A | * | 11/1998 | Mori et al. .................... 365/63 |
| 5,884,099 A | * | 3/1999 | Klingelhofer ................ 710/52 |
| 5,901,100 A | * | 5/1999 | Taylor ........................ 365/219 |
| 5,905,876 A | * | 5/1999 | Pawlowski et al. ......... 711/117 |
| 5,923,895 A | * | 7/1999 | Nookala et al. .............. 365/83 |
| 5,925,142 A | * | 7/1999 | Raad et al. ................. 714/719 |
| 5,978,891 A | * | 11/1999 | Takeda ....................... 711/167 |
| 6,005,823 A | * | 12/1999 | Martin et al. .......... 365/230.08 |
| 6,044,416 A | * | 3/2000 | Hasan ......................... 710/52 |
| 6,161,165 A | * | 12/2000 | Solomon et al. ............ 711/114 |

\* cited by examiner

*Primary Examiner*—Donald Sparks
*Assistant Examiner*—Nasser Moazzami
(74) *Attorney, Agent, or Firm*—Schwegman, Lundberg, Woessner & Kluth, P.A.

(57) ABSTRACT

A dual FIFO architecture is described which allows internal read and write operations in a DRAM memory device to be decoupled from the read and write operations associated with the processor-memory bus. The application of separate read and write FIFO buffers interfaced with a plurality of memory banks on a DRAM memory device thus compensates for mismatches in communications speed that may exist between the rate at which data is provided to the memory banks from the processor-memory bus and likewise, the rate at which the memory banks can provide data to the processor-memory bus. Furthermore, the decoupling of internal memory operations with external reads and writes permits prioritization of read and write commands. Since the FIFOs serve directly as a data buffer to the memory banks, high speed computer operations is permitted because the microprocessor and the memory bus may operate at their own natural frequency without being restricted by the speed of the DRAM memory device.

95 Claims, 3 Drawing Sheets

INTERNAL BUFFERED BUS FOR A DRUM

TECHNICAL FIELD OF THE INVENTION

The present invention relates generally to memory devices and in particular to an architecture and method for controlling data transfers over an internal buffered bus for a DRAM.

BACKGROUND OF THE INVENTION

In a computer system, the various subsystems interface and communicate with one another via a bus. There is typically a bus between the computer's main memory and the processor, as well as a bus between the processor and the input/output (I/O) devices. Processor-memory buses are short, generally high speed and are matched to the memory system so as to maximize memory-processor bandwidth. I/O buses, by contrast, can be lengthy, and can have different types of devices in varying bandwidths connected to them.

Since the I/O bus usually transfers data to or from memory, the speed of the memory affects performance of the computer system. Usually, integrated memory circuits are slower in operation than the processor. This mismatch in memory access speed versus processor speed presents a problem, particularly since the computer system may have to wait a certain amount of time for each memory access operation. This problem is illustrated in real-time data acquisition systems, for example, where a data source outputs data at a high rate, valuable information might be lost if the receiving device is unable to process the information in an orderly fashion at the rate at which data is generated.

To reduce the time required to send data between a peripheral device and the memory circuit, a digital data buffer circuit, arranged as a First-in/First-out (FIFO) buffer may be used. The FIFO is normally connected external or separate from the memory circuits and compensates for the difference in communications speed by allowing the sending device to write or transmit data into the FIFO at its own rate without being interrupted by the receiving device. Nonetheless, memory access operations associated with transferring data into memory from the FIFO places restrictions upon the read and write operations of the peripheral device with respect to the internal read and write operations of the memory circuit.

With respect to the memory circuits of a computer system, dynamic random access memory modules (DRAMs) are typically utilized. DRAMs are desirable from a cost standpoint even though they are significantly slower than static random access memory modules (SRAMs).

DRAM memory cells are basically charge storage capacitors with access transistors. Due to the capacitance of DRAMs, DRAMs require more time than SRAMs to store or write data into their memory cells, and they require separate refresh circuitry to maintain the charge of each memory cell. Further, for packaging reasons, DRAMs use a multiplexed addressing structure where one-half the memory address, referred to as the row address, is provided in a first cycle and the remainder of the address, the column address, is provided in a second cycle. The use of the multiplexed addressing saves space but consumes time. Consequently, DRAMs require extra time to provided the row and column addresses, as well as extra time to store data in its internal memory cells corresponding to the address. DRAMs require an appreciable amount of set-up and cycle time which can hinder I/O performance. This significant amount of setup time reduces system performance since the system must insert wait states while the DRAM address is being established before allowing transfer of the data.

To increase I/O bus performance, there are a variety of techniques available. However, these techniques may adversely affect other performance metrics. For example, to obtain fast response time for I/O operations, the bus latency must be minimized by streamlining the communication path. On the other hand, to sustain high I/O data rates, the bus bandwidth must be maximized. The bus bandwidth can be increased by using more buffering and by communicating larger blocks of data, both of which increase the bus latency. Clearly these two goals, low latency and bus bandwidth, can lead to conflicting design requirements.

Thus, substantial performance increases in I/O bus performance could be realized if there were a means available which allowed a peripheral device to write data at a high speed while simultaneously allowing the memory to read the data as it is able to, thereby freeing up the peripheral device for other tasks much sooner than would otherwise be possible. Further, if internal read operations in a memory device could be prioritized over internal write operations in the same memory device, processor-memory bus performance likewise would be improved.

For the reasons stated above, and for other reasons stated below which will become apparent to those skilled in the art upon reading and understanding the present specification, there is a need in the art for a computer system which utilizes FIFOs placed directly on a memory circuit to improve system performance in the exchange of data between a memory device and a microprocessor.

SUMMARY OF THE INVENTION

The above mentioned problems associated with improving computer system performance in the exchange of data between a microprocessor and a memory device are addressed by the present invention which will be understood by reading and studying the following specification.

The present invention describes the application of separate read and write FIFO buffers interfaced between an external connection of a memory device and with a memory array contained within the memory device. The use of FIFOs compensate for mismatches in communications speed that may exist between the microprocessor and the memory array. The use of separate read and write FIFOs permit decoupling of internal memory operations with external read and write operations such that internal and external operations are independently performed. Decoupling of internal memory operations with external reads and writes also permits prioritization of read and write commands such that if the memory device has both a read and a write command to execute, the write will be delayed in execution while the read is performed.

In particular, the present invention is a memory device comprising a memory array having a plurality of array banks, an internal communications bus coupled to the plurality of array banks, an external connection for coupling to an external bus, and input and output first-in first-out (FIFO) buffers located between the external connection and the internal communication bus for decoupling internal memory operations from external operations such that the internal and external operations are independently performed.

An embodiment of the present invention is a dynamic random access memory (DRAM). The memory device further comprising a controller that prioritizes internal read and write operations such that if the memory device has both a read and a write command to execute, the write will be delayed in execution while the read is performed. Two alternative embodiments would allow prioritizing write commands above read commands or would allow an external device such as the microprocessor to set the relative priorities of individual read and write commands. Also, the internal communications bus has a bus width wider than the external bus and operates at a slower frequency than the external bus.

The memory device further comprising a multiplexer located between the FIFO buffers and the external connection for interfacing the external bus having a bus width and a speed different than a bus width and a speed of the internal communications bus.

In another illustrative embodiment, the present invention is a processing system comprising a microprocessor, and a memory device coupled to the microprocessor via control and data lines, wherein the memory device further comprising a memory array and input and output first-in first-out (FIFO) buffers located between the data lines and the memory array for decoupling internal memory operations from external read and write operations such that the internal and external operations are independently performed.

In a further embodiment of the invention, a method of exchanging data between a microprocessor and a memory device comprising the steps of transmitting and receiving data via an external connection of the memory device, buffering data in input and output first-in first-out (FIFO) buffers located between the external connection and an internal communications bus, and reading and writing data to a plurality of memory array banks coupled to the internal communications bus such that internal memory operations are independently performed from external operations.

In a still further embodiment, the present invention is a memory device comprising a memory array having a plurality of array banks, an internal communications bus coupled to the plurality of array banks, an external connection for coupling to an external data lines, an input path located between the external data lines and the memory array comprising a demultiplexer and a write first-in first-out (FIFO) buffer coupled to the demultiplexer for decoupling internal write operations from external read and write operations such that the internal write and external memory operations are independently performed, an output path located between the memory array and the external data lines comprising a multiplexer and a read first-in first-out (FIFO) buffer coupled to the multiplexer for decoupling internal read operations from external read and write operations such that the internal read and external memory operations are independently performed, and a controller coupled to the multiplexers for prioritizing internal read and write operations such that if the memory device has both a read and a write command to execute, the write will be delayed in execution while the read is performed.

Still further embodiments would allow prioritizing write commands above read commands or would allow an external device, such as a microprocessor, to set the priority of individual or groups of read and write commands. Furthermore, the controller controls the multiplexers for data width such that the external data lines have a speed and a bus width different than a bus width and a speed of the internal communications bus.

DETAILED DESCRIPTION OF THE PREFERRED EMBODIMENT

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
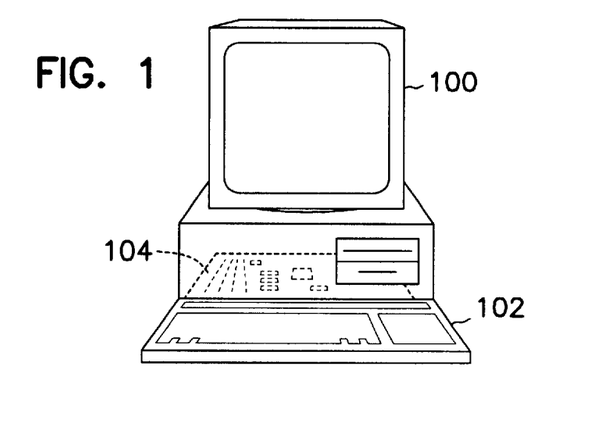
FIG. 1 illustrates a personal computer of the present invention.
Figure 2:
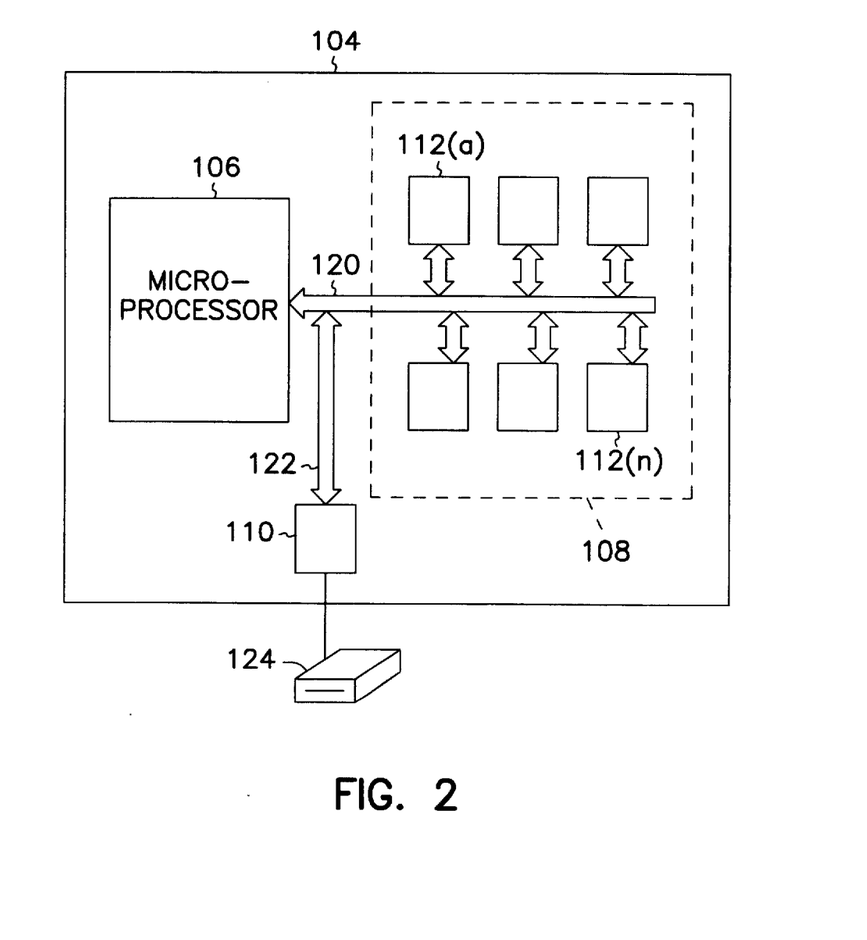
FIG. 2 illustrates a block diagram of a microprocessor of FIG. 1.

Personal computers, as shown in FIGS. 1 and 2, include a monitor 100, keyboard input 102 and a central processing unit 104. The processor unit typically includes microprocessor 106, memory bus circuit 108 having a plurality of memory slots 112(a–n), and other peripheral circuitry 110. Peripheral circuitry 110 permits various peripheral devices 124 to interface processor-memory bus 120 over input/output (I/O) bus 122.

Microprocessor 106 produces control and address signals to control the exchange of data between memory bus circuit 108 and microprocessor 106 and between memory bus circuit 108 and peripheral circuitry 110. This exchange of data is accomplished over high speed memory bus 120 and over high speed I/O bus 122.

Coupled to memory bus 120 are a plurality of memory slots 112(a–n) which receive memory devices well known to those skilled in the art. For example, single in-line memory modules (SIMMs) and dual in-line memory modules (DIMMs) may be used in the implementation of the present invention. Each type of integrated memory device has an associated communications speed which in turn limits the speed data can be read out of or written into memory bus circuit 108.

These memory devices can be produced in a variety of designs which provide different methods of reading from and writing to the dynamic memory cells of memory slots 112. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 108. A typical communication speed using page mode dynamic random access memory (DRAM) device is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 120. Other alternative types of devices include SDRAM, DDR SDRAM, SLDRAM and Direct RDRAM as well as others such as SRAM or Flash memories.

When data must pass through a single communications bus, bus bandwidth limits the rate at which this data may be exchanged. Microprocessor 106 and peripheral devices 124 may not be the limiting factor since they may have higher communications speeds than the memory devices plugged into memory slots 112. Thus, a disadvantage of memory bus 120 is that it creates a communication bottleneck, possibly limiting the maximum I/O data throughput of central processing unit 104. To obtain a faster response time for I/O operations, the bus bandwidth could be increased by communicating larger blocks of data, but this approach presents conflicting design requirements.

Figure 3:
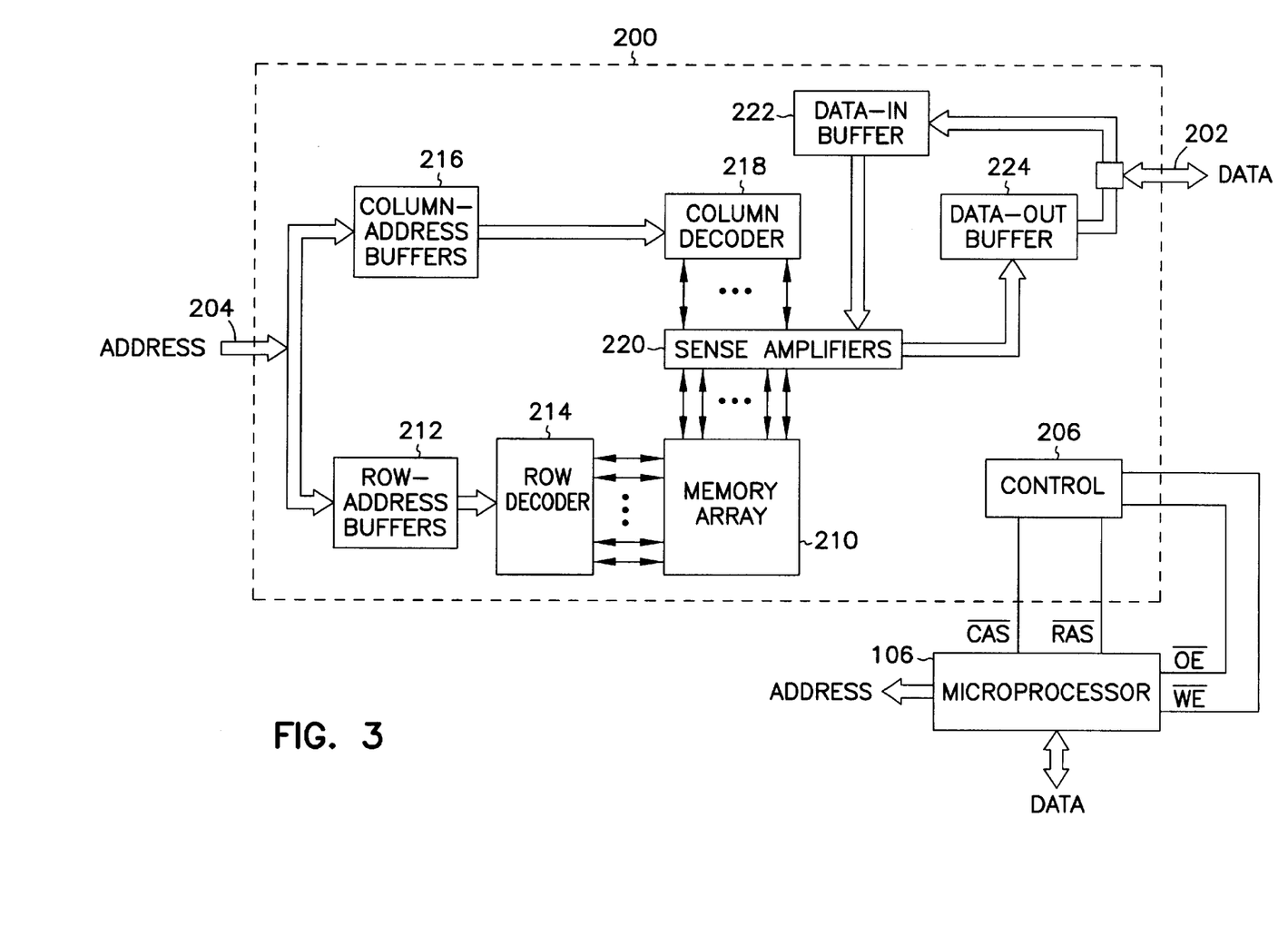
FIG. 3 is a block diagram of a DRAM memory device.

FIG. 3 is a block diagram of an illustrative DRAM device 200 compatible with memory slots 112(a–n). The description of DRAM 200 has been simplified for purposes of illustrating a DRAM memory device and is not intended to be a complete description of all the features of a DRAM. Those skilled in the art will recognize that a wide variety of memory devices may be used in the implementation of the present invention.

Control, address and data information provided over memory bus 120 is further represented by individual inputs to DRAM 200, as shown in FIG. 3. These individual representations are illustrated by data lines 202, address lines 204 and various discrete lines directed to control logic 206.

As is well known in the art, DRAM 200 includes memory array 210 which in turn comprises rows and columns of addressable memory cells. Each memory cell in a row is coupled to a common word line. Additionally, each memory cell in a column is coupled to a common bit line. Each cell in memory array 210 includes a storage capacitor and an access transistor as is conventional in the art. DRAM 200 interfaces with, for example, microprocessor 106 through address lines 204 and data lines 202. Alternatively, DRAM 200 may interface with a DRAM controller, a microcontroller, a chip set or other electronic system. Microprocessor 106 also provides a number of control signals to DRAM 200, including but not limited to, row and column address strobe signals RAS* and CAS*, write enable signal WE*, an output enable signal OE* and other conventional control signals.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high. However, an asterisk (*) following the signal name in this application indicates that the signal is negative or inverse logic. Negative or inverse logic is considered active when the signal is low.

Row address buffer 212 and row decoder 214 receive and decode row addresses from row address signals provided on address lines 204 by microprocessor 106. Each unique row address corresponds to a row of cells in memory array 210. Row decoder 214 includes a word line driver, an address decoder tree, and circuitry which translates a given row address received from row address buffers 212 and selectively activates the appropriate word line of memory array 210 via the word line drivers.

Column address buffer 216 and column decoder 218 receive and decode column address signals provided on address lines 204. Column decoder 218 also determines when a column is defective and the address of a replacement column.

Column decoder 218 is coupled to sense amplifiers 220. Sense amplifiers 220 are coupled to complementary pairs of bit lines of memory array 210.

Sense amplifiers 220 are coupled to data-in buffer 222 and data-out buffer 224. Data-in buffers 222 and data-out buffers 224 are coupled to data lines 202. During a write operation, data lines 202 provide data to data-in buffer 222. Sense amplifier 220 receives data from data-in buffer 222 and stores the data in memory array 210 as a charge on a capacitor of a cell at an address specified on address lines 204.

During a read operation, DRAM 200 transfers data to microprocessor 106 from memory array 210. Complementary bit lines for the accessed cell are equilibrated during a precharge operation to a reference voltage provided by an equilibration circuit and a reference voltage supply. The charge stored in the accessed cell is then shared with the associated bit lines a sense amplifier of sense amplifiers 220 detects and amplifies a difference in voltage between the complementary bit lines. The sense amplifier passes the amplified voltage to data-out buffer 224.

Control logic 206 is used to control the many available functions of DRAM 200. In addition, various control circuits and signals not detailed herein initiate and synchronize DRAM 200 operation as known to those skilled in the art. As stated above, the description of DRAM 200 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Figure 4:
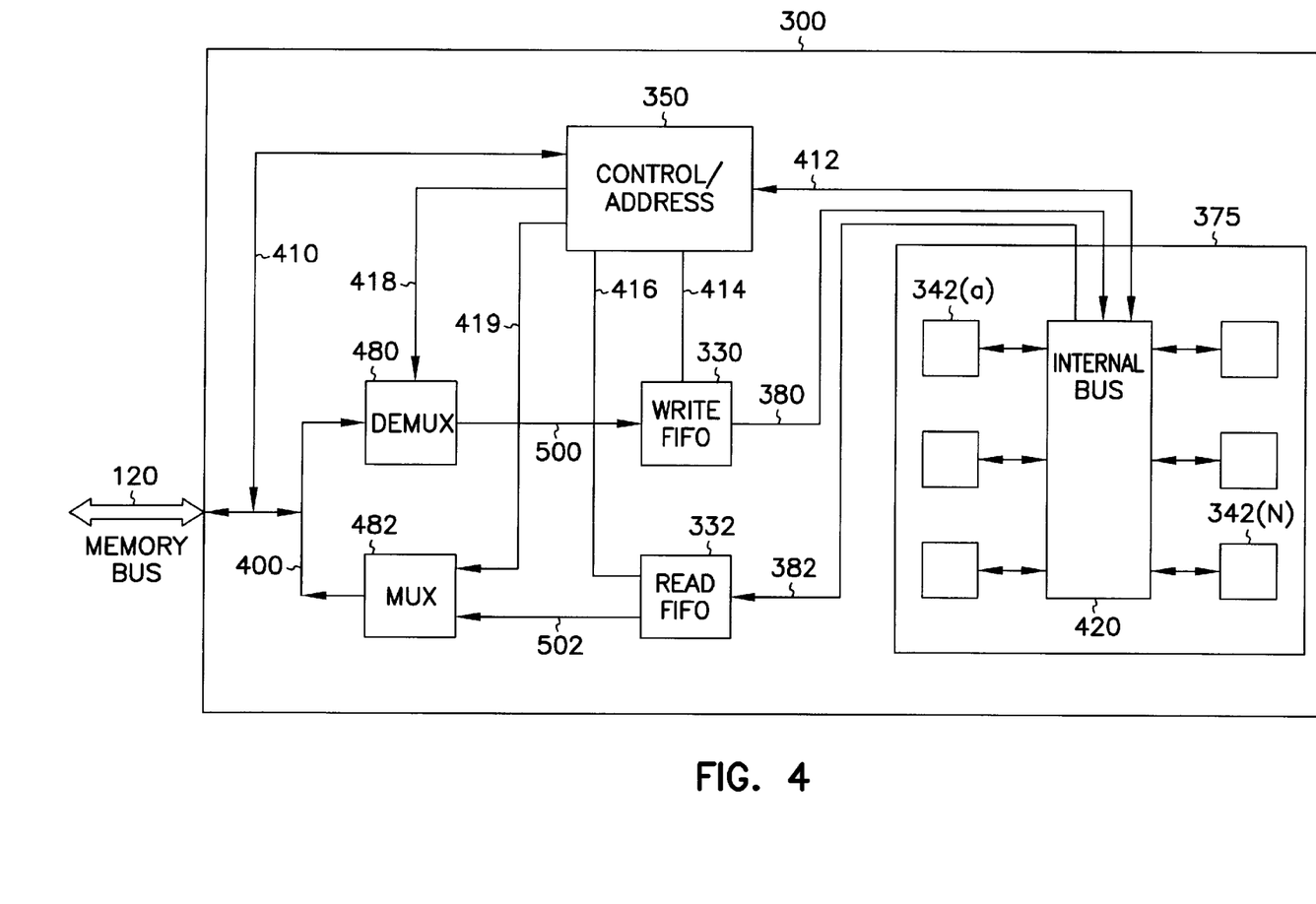
FIG. 4 is a block diagram of an illustrative embodiment of a DRAM memory device using dual First-in-First-out (FIFO) buffers according to the teachings of the present invention.

FIG. 4 is a block diagram of an illustrative embodiment of DRAM memory device 300 using input and output First-in-First-out (FIFO) buffers 330,332 according to the teachings of the present invention. The representation of DRAM 300 has been simplified for purposes of illustrating the present invention and is not intended to be a complete description of all the features of a DRAM. The present invention places dual FIFO buffers 330,332 directly on the same chip as DRAM 300. DRAM device 300 is compatible with memory slots 112(a–n) illustrated in FIG. 2.

This dual FIFO 330,332 architecture allows read and write operations in DRAM memory banks 342(a–n) to be decoupled from the external read and write operations associated with memory bus 120. Decoupling increases system performance by allowing DRAM 300 operations to proceed at its natural speed while the operations associated with memory bus 120 proceed at its own natural speed. Varying bus widths between memory bus 120 and internal bus 420 are also compatible with the present invention. For example, high speed internal DRAM bus 420 may be eight bytes wide operating at a cycle rate N while memory bus 120 may operate at a cycle rate 4N (four times faster) but only providing two bytes per cycle. For example, the DRAM bus is eight bytes wide per cycle while operating at 33 MHZ while the external bus is two bytes per cycle wide while operating at 132 MHZ.

Control logic, address and data information for DRAM 300 in FIG. 4 is provided by individual inputs via data lines 202, address lines 204 and various discrete lines to control logic 206, as shown in FIG. 3. This control logic, address and data information is represented by memory bus 120 in FIG. 4.

FIFO buffers 330,332 are coupled to memory bus 120 via multiplexer/demultiplexer 482,480. Data to/from memory banks 342(a–n) are first buffered by FIFOs 330,332 through interfaces 380,382. Single or multiple memory banks 342 may be used with the present invention. Read and write operations are separated between the two FIFOs 330,332. Input FIFO 330 performs write operations into memory banks 342 over interface 380 while output FIFO 332 performs read operations from memory banks 342 over interface 382.

FIFO buffers 330,332 are not only intended to compensate for any mismatch that may exist between the rate at which data is produced and the rate at which it can be accepted, but to also allow greater flexibility to improve system performance of central processing unit 106. For example, priority can be assigned to internal read and write memory operations by controller 350 such that reads can be higher priority than writes. For example, if the memory device has both a read and a write command to execute, the write will be delayed in execution while the read is performed. This permits the spacing of writes in time such that they are performed when reads are not occurring or between reads in some optimum timed fashion. Alternatively, writes are prioritized higher than reads, or control of priority among reads and writes is set by an external device.

For representation purposes of the present invention, memory bus 120, as shown in FIG. 4, represents control, data and address information for DRAM device 300. The write data portion of memory bus 120 is first directed to demultiplexer 480 over interface 400. From demultiplexer 480, data is then written to FIFO 330 over interface 500. FIFO 330 buffers data until accepted by memory array 375 over interface 380. Conversely, data to be output from memory array 375 to memory bus 120 is first directed to read FIFO 332 over interface 382. Read FIFO 332 buffers data until accepted by memory bus 120. From FIFO 332, data is received over interface 502 for multiplexing by multiplexer 482 in order to interface memory bus 120 over connection 400. Corresponding address and control information is directed to controller 350 over interface 410. Address and data bus information and control logic implementation, as illustrated in FIG. 4, is well known in the art.

Controller 350 interfaces with each of the key components to direct data to be read into or written out of memory banks 342 via the following interfaces: interface 412 to internal bus 420, interface 414,416 to FIFOs 330,332 respectively, and interfaces 418,419 to demultiplexer 480 and multiplexer 482, respectively. Since FIFOs 330,332 serve directly as a data buffer to memory array 375, this permits processor 106 and memory bus 120 to operate at their natural frequencies.

Optimum DRAM 300 performance is achieved with the use of FIFOs 330,332 because memory read and write requests and procedures may be queued to allow high speed operation of memory array 375. The present invention may also be used with a single bank 342(a) as well as with an embedded memory interface in lieu of memory bus 120.

FIFOs 330,332 buffer the data in serial lists until it can be used. The serial lists are stored in memory and require overhead to maintain them. These FIFO structures can be implemented at many levels from all software to all hardware. The software implementations are often the most flexible but yield the lowest performance. The hardware implementations, while less flexible, give the highest performance.

The present invention is a fundamentally different architecture that couples a plurality of memory banks 342 sharing an internal bus in a DRAM memory device in array 375 to input and output FIFO buffers 330, 332. FIFOs then interface directly with memory bus 120. FIFO buffers 330, 332 function in either direction so that a computer system has the ability to que up numerous demands for reads and writes. This architecture permits prioritization of reads over writes with prioritization governed by controller 350 such that if memory device 300 has both a read and a write command to execute, the write will be delayed in execution while the read is performed. Depending on intended applications, if peripheral device 124 was to extensively write data into memory, controller 350 provides prioritization commands such that memory reads would have priority over memory writes. This architecture alternatively allows prioritization of writes over reads or priority of reads and writes is established by an external device.

One aspect of read/write prioritization is that writes could be spaced in time such that they are performed when reads are not occurring or between reads in some optimum fashion. Thus, FIFO buffers 330, 332 provide microprocessor 106 flexibility while appearing to operate at a very high speed. This architecture provides the capability for a number of memory banks 342 to operate in page mode and if latched together, system variability is provided on which to build from.

Utilization of FIFOs 330, 332 permits memory bus 120 to transmit and retrieve data with memory banks 342 at a natural communications speed while FIFOs 330,332 fill up at a rate dictated by the communications speed of memory banks 342. In order to successfully communicate at a different data rate, FIFOs 330, 332 must be combined with multiplexer 482 and demultiplexer 480. Multiplexer 482 and demultiplexer 480 also permits communication over two different physical bus widths. Controller 350 controls multiplexer 482 and demultiplexer 480 for data width such that external data lines 202 have a speed and a bus width different than a bus width and a speed of internal communications bus 420. In other words, external memory bus 120 may physically exist as a narrower bus than the width of internal us 420. Thus, you could have a narrow bus feeding a wider bus that would allow you to have a high speed response via FIFOs 330, 332.

CONCLUSION

The application of separate read and write FIFO buffers 330, 332 interfaced with a plurality of memory banks 342 on a DRAM memory device 300 compensates for mismatches in communications speed that may exist between the rate at which data is provided to memory banks 342 from memory bus 120 and the rate at which memory banks 342 can provide data to memory bus 120. The present invention is realized because input and output FIFOs 330,332 decouples internal DRAM 300 memory operations with external read and write operations associated memory bus 120. Since FIFOs 330, 332 serve directly as a data buffer to memory banks 342, high speed computer operations is permitted because microprocessor 106 and memory bus 120 may operate at their own respective natural frequency without being restricted by the speed of DRAM memory device 300. Decoupling of internal DRAM 300 memory operations with external reads and writes also permits prioritization of read and write commands by controller 350. In lieu of memory bus 120, DRAM 300 may interface directly with an embedded memory interface.

What is claimed is:

1. A memory device comprising:
    a memory array having a plurality of array banks in a single integrated circuit chip;

an internal bus in the chip coupled to the plurality of array banks;

an external connection in the chip to be coupled to an external bus; multiplexer/demultiplexer circuit in the chip coupled to the external connection: and input and output first-in first-out (FIFO) buffers located in the chip between the multiplexer/demultiplexer circuit and the internal bus to decouple internal memory operations from external operations such that the internal and external operations are independently performed.

2. The memory device of claim 1 wherein the memory device comprises a dynamic random access memory (DRAM).

3. The memory device of claim 1, further comprising a controller in the chip to prioritize internal read and write operations such that if the memory device has both a read operation and a write operation to execute, the write operation will be delayed while the read operation is executed.

4. The memory device of claim 1, further comprising a controller in the chip to prioritize internal read and write operations such that if the memory device has both a read operation and a write operation to execute, the read operation is delayed while the write operation is executed.

5. The memory device of claim 1, further comprising a controller in the chip to prioritize internal read and write operations such that if the memory device has both a read operation and a write operation to execute, a priority of execution between the read operation and the write operation is established by an external device.

6. The memory device of claim 1 wherein the internal bus has a bus width wider than a bus width of the external bus and operates at a slower frequency than the external bus.

7. The memory device of claim 6 wherein the internal bus operates with a bus width of 64 bits per cycle while the external bus operates with a bus width of 16 bits per cycle.

8. The memory device of claim 6 wherein the internal bus operates with a bus width of 128 bits per cycle while the external bus operates with a bus width of 16 bits per cycle.

9. The memory device of claim 6 wherein the internal bus operates with a bus width of 256 bits per cycle while the external bus operates with a bus width of 16 bits per cycle.

10. The memory device of claim 1 wherein the multiplexer/demultiplexer circuit comprises a multiplexer in the chip located between the output FIFO buffer and the external connection to interface with the external bus.

11. The memory device of claim 1 wherein the multiplexer/demultiplexer circuit comprises a demultiplexer in the chip located between the input FIFO buffer and the external connection to interface with the external bus.

12. A processing system comprising:
a microprocessor; and
a memory device coupled to the microprocessor via control and data lines in an external bus, wherein the memory device further comprises:
a memory array in a single integrated circuit chip;
a multiplexer/demultiplexer circuit in the chip coupled to the data lines; and
input and output first-in first-out (FIFO) buffers located in the chip between the multiplexer/demultiplexer circuit and the memory array to decouple internal memory operations from external read and write operations such that the internal and external operations are independently performed.

13. The processing system of claim 12 wherein the memory array comprises a plurality of array banks.

14. The processing system of claim 13 wherein the plurality of array banks are coupled to the FIFO buffers via an internal bus.

15. The processing system of claim 14 wherein the internal bus has a bus width wider than a bus width of the external bus and operates at a slower frequency than the external bus.

16. The processing system of claim 12 wherein the memory device comprises a dynamic random access memory (DRAM).

17. The processing system of claim 12, further comprising a controller in the chip to prioritize internal read and write operations such that if the memory device has both a read operation and a write operation to execute, the write operation is delayed while the read operation is executed.

18. The processing system of claim 12, further comprising a controller in the chip to prioritize internal read and write operations such that if the memory device has both a read operation and a write operation to execute, the read operation is delayed while the write operation is executed.

19. The processing system of claim 12, further comprising a controller in the chip to prioritize internal read and write operations such that if the memory device has both a read operation and a write operation to execute, a priority of execution between the read operation and the write operation is established by an external device.

20. The processing system of claim 12 wherein the multiplexer/demultiplexer circuit comprises a multiplexer in the chip located between the output FIFO buffer and the data lines to interface with the external bus.

21. The processing system of claim 12 wherein the multiplexer/demultiplexer circuit comprises a demultiplexer in the chip located between the input FIFO buffer and the data lines to interface with the external bus.

22. A method of exchanging data between a microprocessor and a memory device comprising:
transmitting and receiving data via an external connection in a single integrated circuit chip comprising the memory device;
multiplexing/demultiplexing the data in a multiplexer/demultiplexer circuit located in the chip and coupled to the external connection;
buffering data in input and output first-in first-out (FIFO) buffers located in the chip between the multiplexer/demultiplexer circuit and an internal bus in the chip; and
reading and writing data to a plurality of memory array banks in the chip coupled to the internal bus such that internal memory operations are independently performed from external operations.

23. The method of claim 22 further comprising prioritizing internal read and write operations such that if the memory device has both a read operation and a write operation to execute, the write operation is delayed while the read operation is executed.

24. The method of claim 22 further comprising prioritizing internal read and write operations such that if the memory device has both a read operation and a write operation to execute, the read operation is delayed while the write operation is executed.

25. The method of claim 22 further comprising prioritizing internal read and write operations such that if the memory device has both a read operation and a write operation to execute, a delay of execution of the read operation is established by an external device while the write operation is executed.

26. The method of claim 22 further comprising prioritizing internal read and write operations such that if the memory device has both a read operation and a write operation to execute, a delay of execution of the write operation is established by an external device while the read operation is executed.

27. The method of claim 22 wherein multiplexing the data further comprises:
multiplexing the data to the input first-in first-out (FIFO) buffer in a demultiplexer located in the chip between the external connection and the input first-in first-out (FIFO) buffer; and
multiplexing the data from the output first-in first-out (FIFO) buffer to the external connection in a multiplexer located in the chip between the external connection and the output first-in first-out (FIFO) buffer.

28. A memory device comprising:
a memory array having a plurality of array banks;
an internal bus coupled to the plurality of array banks;
an external connection to be coupled to external data lines;
an input path located between the external data lines and the memory array and further comprising:
a demultiplexer; and
a write first-in first-out (FIFO) buffer coupled to the demultiplexer to decouple internal write operations from external read and write operations such that the internal write operations and the external read and write operations are independently performed;
an output path located between the memory array and the external data lines and further comprising:
a multiplexe; and
a read first-in first-out (FIFO) buffer coupled to the multiplexer to decouple internal read operations from the external read and write operations such that the internal read operations and the external read and write operations are independently performed; and
a controller coupled to the multiplexer and to the demultiplexer to prioritize the internal read and write operations such that if the memory device has both a read operation and a write operation to execute, the write operation will be delayed while the read operation is executed.

29. The memory device of claim 28, wherein the external data lines have a speed and a bus width different than a bus width and a speed of the internal bus.

30. A memory device comprising:
a plurality of memory cells in a single integrated circuit chip;
an input/output port in the chip to be coupled to an external bus;
a multiplexer/demultiplexer circuit coupled to the port; an input first-in first-out (FIFO) buffer coupled between the multiplexer/demultiplexer circuit and the memory cells in the chip to buffer information received through the port and the multiplexer/demultiplexer circuit to be written to the memory cells; and
an output first-in first-out (FIFO) buffer coupled between the multiplexer/demultiplexer circuit and the memory cells in the chip to buffer information read from the memory cells and transmitted to the external bus through the port and the multiplexer/demultiplexer circuit.

31. The memory device of claim 30 wherein:
the memory cells comprise:
a plurality of banks of memory cells; and
a bus in the chip, the bus being internal to the memory device and coupled to the banks of memory cells, the input first-in first-out (FIFO) buffer, and the output first-in first-out (FIFO) buffer;
the memory device comprises a dynamic random access memory (DRAM);
the multiplexer/demultiplexer circuit comprises:
a multiplexer in the chip located between the output first-in first-out (FIFO) buffer and the port to multiplex information transmitted to the external bus through the port: and
a demultiplexer in the chip located between the input first-in first-out (FIFO) buffer and the port to demultiplex information received through the port: and
further comprising a controller in the chip to prioritize read and write operations in the memory device.

32. A memory device comprising:
a memory array having a plurality of array banks in a single integrated circuit chip;
an internal bus in the chip coupled to the plurality of array banks;
an external connection in the chip to be coupled to an external bus;
input and output first-in first-out (FIFO) buffers located in the chip between the external connection and the internal bus to decouple internal memory operations from external operations such that the internal and external operations are independently performed; and
a controller in the chip to prioritize internal read and write operations such that if the memory device has both a read operation and a write operation to execute, the write operation will be delayed while the read operation is executed.

33. The memory device of claim 32 wherein the memory device comprises a dynamic random access memory (DRAM).

34. The memory device of claim 32 wherein the internal bus has a bus width wider than a bus width of the external bus and operates at a slower frequency than the external bus.

35. The memory device of claim 32, further comprising:
a multiplexer in the chip located between the output FIFO buffer and the external connection to interface with the external bus; and
a demultiplexer in the chip located between the input FIFO buffer and the external connection to interface with the external bus.

36. A memory device comprising:
a memory array having a plurality of array banks in a single integrated circuit chip;
an internal bus in the chip coupled to the plurality of array banks;
an external connection in the chip to be coupled to an external bus;
input and output first-in first-out (FIFO) buffers located in the chip between the external connection and the internal bus to decouple internal memory operations from external operations such that the internal and external operations are independently performed; and
a controller in the chip to prioritize internal read and write operations such that if the memory device has both a read operation and a write operation to execute, the read operation is delayed while the write operation is executed.

37. The memory device of claim 36 wherein the memory device comprises a dynamic random access memory (DRAM).

38. The memory device of claim 36 wherein the internal bus has a bus width wider than a bus width of the external bus and operates at a slower frequency than the external bus.

39. The memory device of claim 36, further comprising:
a multiplexer in the chip located between the output FIFO buffer and the external connection to interface with the external bus; and
a demultiplexer in the chip located between the input FIFO buffer and the external connection to interface with the external bus.

40. A memory device comprising:
a memory array having a plurality of array banks in a single integrated circuit chip;
an internal bus in the chip coupled to the plurality of array banks;
an external connection in the chip to be coupled to an external bus;
input and output first-in first-out (FIFO) buffers located in the chip between the external connection and the internal bus to decouple internal memory operations from external operations such that the internal and external operations are independently performed; and
a controller in the chip to prioritize internal read and write operations such that if the memory device has both a read operation and a write operation to execute, a priority of execution between the read operation and the write operation is established by an external device.

41. The memory device of claim 40 wherein the memory device comprises a dynamic random access memory (DRAM).

42. The memory device of claim 40 wherein the internal bus has a bus width wider than a bus width of the external bus and operates at a slower frequency than the external bus.

43. The memory device of claim 40, further comprising:
a multiplexer in the chip located between the output FIFO buffer and the external connection to interface with the external bus; and
a demultiplexer in the chip located between the input FIFO buffer and the external connection to interface with the external bus.

44. A memory device comprising:
a memory array having a plurality of array banks in a single integrated circuit chip;
an internal bus in the chip coupled to the plurality of array banks;
an external connection in the chip to be coupled to an external bus;
input and output first-in first-out (FIFO) buffers located in the chip between the external connection and the internal bus to decouple internal memory operations from external operations such that the internal and external operations are independently performed; and
a multiplexer in the chip located between the output FIFO buffer and the external connection to interface with the external bus.

45. The memory device of claim 44 wherein the memory device comprises a dynamic random access memory (DRAM).

46. The memory device of claim 44 further comprising a controller in the chip to prioritize internal read and write operations.

47. The memory device of claim 44 wherein the internal bus has a bus width wider than a bus width of the external bus and operates at a slower frequency than the external bus.

48. The memory device of claim 44, further comprising a demultiplexer in the chip located between the input FIFO buffer and the external connection to interface with the external bus.

49. A memory device comprising:
a memory array having a plurality of array banks in a single integrated circuit chip;
an internal bus in the chip coupled to the plurality of array banks;
an external connection in the chip to be coupled to an external bus;
input and output first-in first-out (FIFO) buffers located in the chip between the external connection and the internal bus to decouple internal memory operations from external operations such that the internal and external operations are independently performed; and
a demultiplexer in the chip located between the input FIFO buffer and the external connection to interface with the external bus.

50. The memory device of claim 49 wherein the memory device comprises a dynamic random access memory (DRAM).

51. The memory device of claim 49, further comprising a controller in the chip to prioritize internal read and write operations.

52. The memory device of claim 49 wherein the internal bus has a bus width wider than a bus width of the external bus and operates at a slower frequency than the external bus.

53. The memory device of claim 49, further comprising a multiplexer in the chip located between the output FIFO buffer and the external connection to interface with the external bus.

54. A processing system comprising:
a microprocessor; and
a memory device coupled to the microprocessor via control and data lines in an external bus, wherein the memory device further comprises:
a memory array in a single integrated circuit chip;
input and output first-in first-out (FIFO) buffers located in the chip between the data lines and the memory array to decouple internal memory operations from external read and write operations such that the internal and external operations are independently performed; and
a controller in the chip to prioritize internal read and write operations such that if the memory device has both a read operation and a write operation to execute, the write operation is delayed while the read operation is executed.

55. The processing system of claim 54 wherein the memory array comprises a plurality of array banks.

56. The processing system of claim 55 wherein the plurality of array banks are coupled to the FIFO buffers via an internal bus.

57. The processing system of claim 56 wherein the internal bus has a bus width wider than a bus width of the external bus and operates at a slower frequency than the external bus.

58. The processing system of claim 54 wherein the memory device comprises a dynamic random access memory (DRAM).

59. The processing system of claim 54, further comprising:
a multiplexer in the chip located between the output FIFO buffer and the data lines to interface with the external bus; and
a demultiplexer in the chip located between the input FIFO buffer and the data lines to interface with the external bus.

60. A processing system comprising:

a microprocessor; and a memory device coupled to the microprocessor via control and data lines in an external bus, wherein the memory device further comprises:

a memory array in a single integrated circuit chip;

input and output first-in first-out (FIFO) buffers located in the chip between the data lines and the memory array to decouple internal memory operations from external read and write operations such that the internal and external operations are independently performed; and a controller in the chip to prioritize internal read and write operations such that if the memory device has both a read operation and a write operation to execute, the read operation is delayed while the write operation is executed.

61. The processing system of claim 60 wherein the memory array comprises a plurality of array banks.

62. The processing system of claim 61 wherein the plurality of array banks are coupled to the FIFO buffers via an internal bus.

63. The processing system of claim 62 wherein the internal bus has a bus width wider than a bus width of the external bus and operates at a slower frequency than the external bus.

64. The processing system of claim 60 wherein the memory device comprises a dynamic random access memory (DRAM).

65. The processing system of claim 60, further comprising:

a multiplexer in the chip located between the output FIFO buffer and the data lines to interface with the external bus; and a demultiplexer in the chip located between the input FIFO buffer and the data lines to interface with the external bus.

66. A processing system comprising:

a microprocessor; and a memory device coupled to the microprocessor via control and data lines in an external bus, wherein the memory device further comprises:

a memory array in a single integrated circuit chip;

input and output first-in first-out (FIFO) buffers located in the chip between the data lines and the memory array to decouple internal memory operations from external read and write operations such that the internal and external operations are independently performed; and a controller in the chip to prioritize internal read and write operations such that if the memory device has both a read operation and a write operation to execute, a priority of execution between the read operation and the write operation is established by an external device.

67. The processing system of claim 66 wherein the memory array comprises a plurality of array banks.

68. The processing system of claim 67 wherein the plurality of array banks are coupled to the FIFO buffers via an internal bus.

69. The processing system of claim 68 wherein the internal bus has a bus width wider than a bus width of the external bus and operates at a slower frequency than the external bus.

70. The processing system of claim 66 wherein the memory device comprises a dynamic random access memory (DRAM).

71. The processing system of claim 66, further comprising:

a multiplexer in the chip located between the output FIFO buffer and the data lines to interface with the external bus; and a demultiplexer in the chip located between the input FIFO buffer and the data lines to interface with the external bus.

72. A processing system comprising:

a microprocessor; and a memory device coupled to the microprocessor via control and data lines in an external bus, wherein the memory device further comprises:

a memory array in a single integrated circuit chip;

input and output first-in first-out (FIFO) buffers located in the chip between the data lines and the memory array to decouple internal memory operations from external read and write operations such that the internal and external operations are independently performed; and a multiplexer in the chip located between the output FIFO buffer and the data lines to interface with the external bus.

73. The processing system of claim 72 wherein the memory array comprises a plurality of array banks.

74. The processing system of claim 73 wherein the plurality of array banks are coupled to the FIFO buffers via an internal bus.

75. The processing system of claim 74 wherein the internal bus has a bus width wider than a bus width of the external bus and operates at a slower frequency than the external bus.

76. The processing system of claim 72 wherein the memory device comprises a dynamic random access memory (DRAM).

77. The processing system of claim 72, further comprising a controller in the chip to prioritize internal read and write operations.

78. The processing system of claim 72 further comprising a demultiplexer in the chip located between the input FIFO buffer and the data lines to interface with the external bus.

79. A processing system comprising:

a microprocessor; and a memory device coupled to the microprocessor via control and data lines in an external bus, wherein the memory device further comprises:

a memory array in a single integrated circuit chip;

input and output first-in first-out (FIFO) buffers located in the chip between the data lines and the memory array to decouple internal memory operations from external read and write operations such that the internal and external operations are independently performed; and a demultiplexer in the chip located between the input FIFO buffer and the data lines to interface with the external bus.

80. The processing system of claim 79 wherein the memory array comprises a plurality of array banks.

81. The processing system of claim 80 wherein the plurality of array banks are coupled to the FIFO buffers via an internal bus.

82. The processing system of claim 81 wherein the internal bus has a bus width wider than a bus width of the external bus and operates at a slower frequency than the external bus.

83. The processing system of claim 79 wherein the memory device comprises a dynamic random access memory (DRAM).

84. The processing system of claim 79 further comprising a controller in the chip to prioritize internal read and write operations.

85. The processing system of claim 79, further comprising a multiplexer in the chip located between the output FIFO buffer and the data lines to interface with the external bus.

86. A method of exchanging data between a microprocessor and a memory device comprising:
transmitting and receiving data via an external connection in a single integrated circuit chip comprising the memory device;
buffering data in input and output first-in first-out (FIFO) buffers located in the chip between the external connection and an internal bus in the chip;
reading and writing data to a plurality of memory array banks in the chip coupled to the internal bus such that internal memory operations are independently performed from external operations; and
prioritizing internal read and write operations such that if the memory device has both a read operation and a write operation to execute, the write operation is delayed while the read operation is executed.

87. The method of claim 86, further comprising:
multiplexing data from the external connection to the input first-in first-out (FIFO) buffer in a demultiplexer located in the chip between the external connection and the input first-in first-out (FIFO) buffer; and
multiplexing data from the output first-in first-out (FIFO) buffer to the external connection in a multiplexer located in the chip between the external connection and the output first-in first-out (FIFO) buffer.

88. A method of exchanging data between a microprocessor and a memory device comprising:
transmitting and receiving data via an external connection in a single integrated circuit chip comprising the memory device;
buffering data in input and output first-in first-out (FIFO) buffers located in the chip between the external connection and an internal bus in the chip;
reading and writing data to a plurality of memory array banks in the chip coupled to the internal bus such that internal memory operations are independently performed from external operations; and
prioritizing internal read and write operations such that if the memory device has both a read operation and a write operation to execute, the read operation is delayed while the write operation is executed.

89. The method of claim 88, further comprising:
multiplexing data from the external connection to the input first-in first-out (FIFO) buffer in a demultiplexer located in the chip between the external connection and the input first-in first-out (FIFO) buffer; and
multiplexing data from the output first-in first-out (FIFO) buffer to the external connection in a multiplexer located in the chip between the external connection and the output first-in first-out (FIFO) buffer.

90. A method of exchanging data between a microprocessor and a memory device comprising:
transmitting and receiving data via an external connection in a single integrated circuit chip comprising the memory device;
buffering data in input and output first-in first-out (FIFO) buffers located in the chip between the external connection and an internal bus in the chip;
reading and writing data to a plurality of memory array banks in the chip coupled to the internal bus such that internal memory operations are independently performed from external operations; and
prioritizing internal read and write operations such that if the memory device has both a read operation and a write operation to execute, a delay of execution of the read operation is established by an external device while the write operation is executed.

91. The method of claim 90, further comprising:
multiplexing data from the external connection to the input first-in first-out (FIFO) buffer in a demultiplexer located in the chip between the external connection and the input first-in first-out (FIFO) buffer; and
multiplexing data from the output first-in first-out (FIFO) buffer to the external connection in a multiplexer located in the chip between the external connection and the output first-in first-out (FIFO) buffer.

92. A method of exchanging data between a microprocessor and a memory device comprising:
transmitting and receiving data via an external connection in a single integrated circuit chip comprising the memory device;
buffering data in input and output first-in first-out (FIFO) buffers located in the chip between the external connection and an internal bus in the chip;
reading and writing data to a plurality of memory array banks in the chip coupled to the internal bus such that internal memory operations are independently performed from external operations; and
prioritizing internal read and write operations such that if the memory device has both a read operation and a write operation to execute, a delay of execution of the write operation is established by an external device while the read operation is executed.

93. The method of claim 92, further comprising:
multiplexing data from the external connection to the input first-in first-out (FIFO) buffer in a demultiplexer located in the chip between the external connection and the input first-in first-out (FIFO) buffer; and
multiplexing data from the output first-in first-out (FIFO) buffer to the external connection in a multiplexer located in the chip between the external connection and the output first-in first-out (FIFO) buffer.

94. A memory device comprising:
an input/output port in a single integrated circuit chip to be coupled to an external bus;
a plurality of memory cells in the chip, the memory cells comprising:
a plurality of banks of memory cells; and
a bus in the chip, the bus being internal to the memory device and coupled to the banks of memory cells;
an input first-in first-out (FIFO) buffer coupled between the port and the memory cells in the chip to buffer information received through the port to be written to the memory cells;
an output first-in first-out (FIFO) buffer coupled between the port and the memory cells in the chip to buffer information read from the memory cells and transmitted to the external bus through the port;
a controller in the chip to prioritize read and write operations in the memory device; and
wherein the memory device comprises a dynamic random access memory (DRAM).

95. The memory device of claim 94, further comprising:
a multiplexer in the chip coupled between the output first-in first-out (FIFO) buffer and the port to multiplex the information read from the memory cells to the port; and
a demultiplexer in the chip coupled between the input first-in first-out (FIFO) buffer and the port to multiplex the information received through the port to be written to the memory cells.

* * * * *

UNITED STATES PATENT AND TRADEMARK OFFICE
CERTIFICATE OF CORRECTION

PATENT NO. : 6,622,224 B1
DATED : September 16, 2003
INVENTOR(S) : Cloud

It is certified that error appears in the above-identified patent and that said Letters Patent is hereby corrected as shown below:

<u>Title page, Item [54] and Column 1, line 1,</u>
Title, delete "DRUM" and insert -- DRAM --, therefor.

<u>Column 6,</u>
Line 15, after "lines" insert -- . --.

<u>Column 11,</u>
Line 28, delete "multiplexe" and insert -- multiplexer --, therefor.

<u>Column 12,</u>
Line 10, delete ":" and insert -- ; --, therefor.

Signed and Sealed this

First Day of June, 2004

JON W. DUDAS
*Acting Director of the United States Patent and Trademark Office*